(12) United States Patent
Iriuda et al.

(10) Patent No.: US 12,173,405 B2
(45) Date of Patent: Dec. 24, 2024

(54) PROCESSING APPARATUS AND PROCESSING METHOD

(71) Applicant: Tokyo Electron Limited, Tokyo (JP)

(72) Inventors: Hiroki Iriuda, Yamanashi (JP); Yoichiro Chiba, Yamanashi (JP); Atsushi Endo, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 293 days.

(21) Appl. No.: 17/472,891

(22) Filed: Sep. 13, 2021

(65) Prior Publication Data

US 2022/0081771 A1    Mar. 17, 2022

(30) Foreign Application Priority Data

Sep. 16, 2020   (JP) ................................ 2020-155808

(51) Int. Cl.
*C23C 16/455* (2006.01)
*C23C 16/52* (2006.01)

(52) U.S. Cl.
CPC .. *C23C 16/45563* (2013.01); *C23C 16/45502* (2013.01); *C23C 16/45544* (2013.01); *C23C 16/45587* (2013.01); *C23C 16/52* (2013.01)

(58) Field of Classification Search
CPC ........ C23C 16/45587; C23C 16/45544; C23C 16/401; C23C 16/45563; C23C 16/45546; C23C 16/45502; C23C 16/52; C23C 16/45578
See application file for complete search history.

(56) References Cited

U.S. PATENT DOCUMENTS

2008/0226820 A1 * 9/2008 Furuya .............. C23C 16/45578
427/255.31

FOREIGN PATENT DOCUMENTS

| JP | 2011-135044 A | 7/2011 |
|---|---|---|
| JP | 2015-185837 A | 10/2015 |
| JP | 2016-181545 A | 10/2016 |
| JP | 2018-164014 A | 10/2018 |

* cited by examiner

*Primary Examiner* — Yuechuan Yu
(74) *Attorney, Agent, or Firm* — Venjuris, P.C.

(57) ABSTRACT

A processing apparatus includes: a processing container having a substantially cylindrical shape and provided with an exhaust slit on a side wall; and a plurality of gas nozzles extending in a vertical direction along an inside of the side wall of the processing container, disposed symmetrically with respect to a straight line connecting a center of the processing container and a center of the exhaust slit, and each configured to eject a same processing gas into the processing container.

14 Claims, 11 Drawing Sheets

FIG. 6

| | UNIT | X1 | X2 | X3 | X4 | X5 | X6 | X7 |
|---|---|---|---|---|---|---|---|---|
| GAS NOZZLE 31 | [sccm] | 0 | 50 | 100 | 150 | 200 | 250 | 300 |
| GAS NOZZLE 34 | [sccm] | 600 | 500 | 400 | 300 | 200 | 100 | 0 |
| GAS NOZZLE 37 | [sccm] | 0 | 50 | 100 | 150 | 200 | 250 | 300 |
| WAFER CENTER GAS CONCENTRATION | [kmol/m³] | 4.50E-6 | 4.53E-6 | 4.57E-6 | 4.60E-6 | 4.62E-6 | 4.62E-6 | 4.61E-6 |
| WAFER EDGE AVERAGE GAS CONCENTRATION | [kmol/m³] | 4.44E-6 | 4.39E-6 | 4.35E-6 | 4.32E-6 | 4.32E-6 | 4.33E-6 | 4.35E-6 |
| WAFER CENTER GAS CONCENTRATION | | 1 | 1 | 1 | 1 | 1 | 1 | 1 |
| WAFER EDGE AVERAGE GAS CONCENTRATION | | 0.987 | 0.969 | 0.951 | 0.938 | 0.935 | 0.937 | 0.942 |

FIG. 8

| | UNIT | Y1 | Y2 | Y3 | Y4 | Y5 |
|---|---|---|---|---|---|---|
| GAS NOZZLE 31 | [sccm] | 200 | 250 | 300 | 350 | 400 |
| GAS NOZZLE 34 | [sccm] | 200 | 200 | 200 | 200 | 200 |
| GAS NOZZLE 37 | [sccm] | 200 | 150 | 100 | 50 | 0 |
| WAFER CENTER GAS CONCENTRATION | [kmol/m$^3$] | 4.62E-6 | 4.61E-6 | 4.60E-6 | 4.59E-6 | 4.57E-6 |
| WAFER EDGE AVERAGE GAS CONCENTRATION | [kmol/m$^3$] | 4.32E-6 | 4.32E-6 | 4.32E-6 | 4.34E-6 | 4.36E-6 |
| WAFER CENTER GAS CONCENTRATION | | 1 | 1 | 1 | 1 | 1 |
| WAFER EDGE AVERAGE GAS CONCENTRATION | | 0.935 | 0.936 | 0.940 | 0.945 | 0.953 |

PROCESSING APPARATUS AND PROCESSING METHOD

CROSS-REFERENCE TO RELATED APPLICATIONS

This application is based on and claims priority from Japanese Patent Application No. 2020-155808 filed on Sep. 16, 2020 with the Japan Patent Office, the disclosure of which is incorporated herein in its entirety by reference.

TECHNICAL FIELD

The present disclosure relates to a processing apparatus and a processing method.

BACKGROUND

There is known a film forming apparatus includes a gas distribution nozzle extending in the vertical direction along an inside of a side wall of a cylindrical shape processing container and having a plurality of gas ejecting holes formed over a length in the vertical direction corresponding to a wafer support range of a wafer boat (see, e.g., Japanese Patent Laid-Open Publication Nos. 2011-135044 and 2016-181545).

SUMMARY

A processing apparatus according to an aspect of the present disclosure includes: a processing container having a substantially cylindrical shape and provided with an exhaust slit on a side wall; and a plurality of gas nozzles extending in a vertical direction along an inside of the side wall of the processing container, disposed symmetrically with respect to a straight line connecting a center of the processing container and a center of the exhaust slit, and each configured to eject the same processing gas into the processing container.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 6 is a view illustrating a result of a simulation in which a film thickness distribution is adjusted by changing a flow rate allocation.

FIG. 8 is a view illustrating a result of a simulation in which a film thickness distribution is adjusted by changing a flow rate allocation.

DETAILED DESCRIPTION

Figure 1:
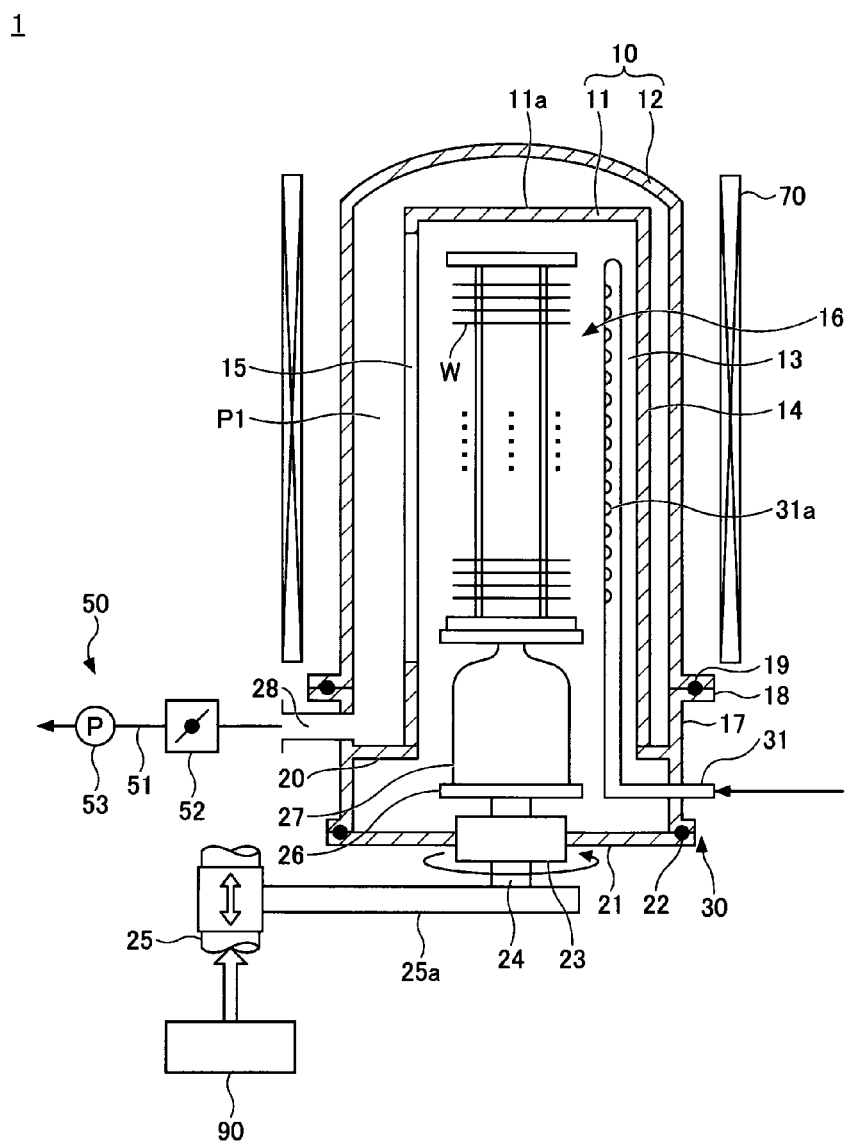
FIG. 1 is a schematic view illustrating an example of a processing apparatus according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, non-limiting exemplary embodiments of the present disclosure will be described with reference to the accompanying drawings. In all of the accompanying drawings, the same or corresponding members or parts are denoted by the same or corresponding reference numerals, and redundant explanations are omitted.

[Processing Apparatus]

Figure 2:
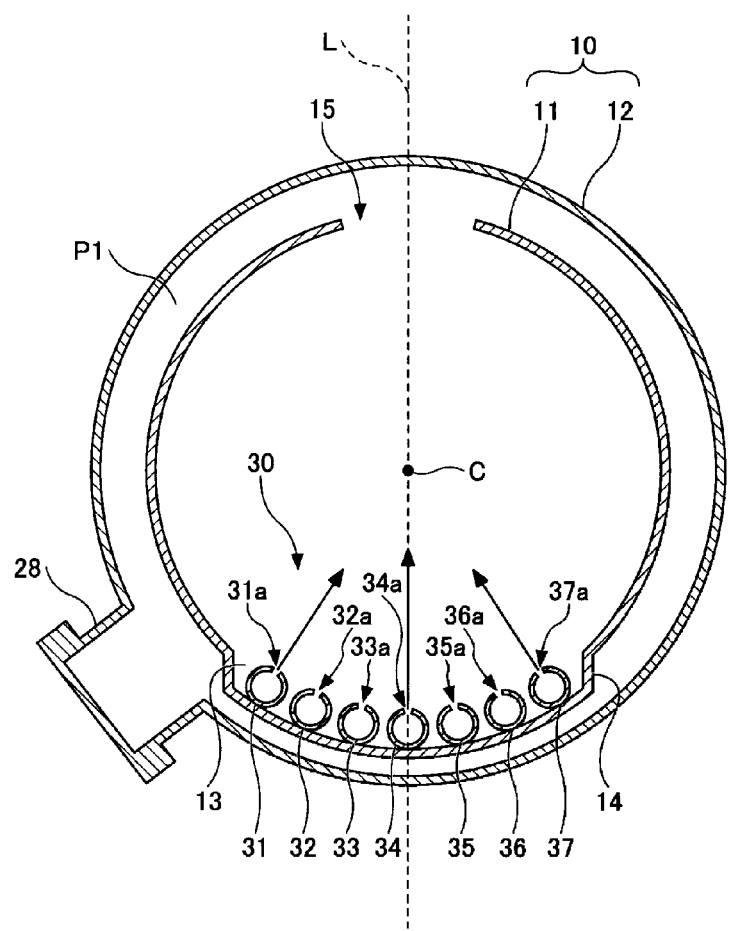
FIG. 2 is a schematic view illustrating an example of arrangement of gas nozzles.

An example of a processing apparatus according to an embodiment will be described with reference to FIGS. 1 and 2. FIG. 1 is a schematic view illustrating an example of the processing apparatus according to the embodiment. FIG. 2 is a schematic view illustrating an example of arrangement of gas nozzles.

The processing apparatus 1 includes a processing container 10, a gas supply 30, an exhauster 50, a heater 70, and a controller 90.

The processing container 10 includes an inner tube 11 and an outer tube 12. The inner tube 11 is formed in a substantially cylindrical shape with a ceiling having an opened lower end. The inner tube 11 has a ceiling 11a formed in, for example, a flat shape. The outer tube 12 is formed in a substantially cylindrical shape with a ceiling having an opened lower end and covering the outside of the inner tube 11. The inner tube 11 and the outer tube 12 are coaxially arranged to be a double tube structure. The inner tube 11 and the outer tube 12 are made of a heat-resistant material such as, for example, quartz.

At one side of the inner tube 11, an accommodation portion 13 that accommodates a gas nozzle along the longitudinal direction (vertical direction) thereof is formed. In the accommodation portion 13, a convex portion 14 is formed by protruding a portion of a side wall of the inner tube 11 toward the outside, and the inside of the convex portion 14 is formed as the accommodation portion 13.

A rectangular exhaust slit 15 is formed on a side wall of an opposite side of the inner tube 11 facing the accommodation portion 13 along the longitudinal direction (vertical direction) of the inner tube 11. The exhaust slit 15 exhausts a gas in the inner tube 11. The exhaust slit 15 has the same length as a length of a boat 16 (to be described later), or extends in each of the upper and lower directions to be longer than the length of the boat 16.

The processing container 10 accommodates the boat 16. The boat 16 holds a plurality of substrates substantially horizontally at intervals in the vertical direction. The substrate may be, for example, a semiconductor wafer (hereinafter, also referred to as a "wafer W").

A lower end of the processing container 10 is supported by a substantially cylindrical manifold 17 made of, for example, stainless steel. A flange 18 is formed on an upper end of the manifold 17, and a lower end of the outer tube 12 is installed to be supported on the flange 18. A seal member 19 such as an O-ring is interposed between the flange 18 and the lower end of the outer tube 12 so that the inside of the outer tube 12 is in an air-tight state.

An annular support 20 is provided on an inner wall of an upper portion of the manifold 17. The support 20 supports the lower end of the inner tube 11. A cover body 21 is air-tightly attached to an opening at the lower end of the manifold 17 through a seal member 22 (e.g., an O-ring). The cover body 21 air-tightly closes the opening at the lower end of the processing container 10, that is, the opening of the manifold 17. The cover body 21 is made of, for example, stainless steel.

A rotation shaft 24 penetrates the center of the cover body 21 and rotatably supports the boat 16 through a magnetic fluid sealing 23. A lower portion of the rotation shaft 24 is rotatably supported by an arm 25a of an elevating mechanism 25 including a boat elevator.

A rotation plate 26 is provided on the upper end of the rotation shaft 24. The boat 16 is placed on the rotation plate 26 to hold the wafer W through a heat preservation stage 27 made of quartz. Therefore, the cover body 21 and the boat 16 are integrally moved up or down by moving the elevating mechanism 25 up or down, so that the boat 16 is able to be inserted into or removed from the processing container 10.

A gas supply 30 is provided at the manifold 17. The gas supply 30 includes a plurality (e.g., seven) of gas nozzles 31 to 37.

The plurality of gas nozzles 31 to 37 are disposed to be aligned in a line along the circumferential direction in the accommodation portion 13 of the inner tube 11. Each of the gas nozzles 31 to 37 is provided in the inner tube 11 along the longitudinal direction thereof, and its base end is bent in an L shape and supported so as to penetrate the manifold 17. Each of the gas nozzles 31 to 37 has a plurality of gas holes 31a to 37a at predetermined intervals along the longitudinal direction. The plurality of gas holes 31a to 37a are oriented toward, for example, a center C of the inner tube 11 (the wafer W side).

The gas nozzles 31, 34, and 37 eject a raw material gas introduced from a raw material gas supply source (not illustrated) through a gas supply pipe (not illustrated) from the plurality of gas holes 31a, 34a, and 37a toward the wafer W in a substantially horizontal direction. That is, the gas nozzles 31, 34 and 37 eject the same raw material gas into the inner tube 11. A flow rate controller (not illustrated) such as a mass flow controller is connected to the gas supply pipe between the rat material gas supply source and the gas nozzles 31, 34, and 37. The flow rate controller changes the flow rate of the raw material gas ejected from the gas nozzles 31, 34, and 37. The raw material gas may be, for example, a gas containing silicon (Si) or metal. The plurality of gas nozzles 31, 34, and 37 have, for example, the same inner diameter. The respective plurality of gas holes 31a, 34a, and 37a are provided in the same range as the height range in which boat 16 is provided, or in a range wider in the vertical direction than the height range in which the boat 16 is provided. Therefore, the gas nozzles 31, 34, and 37 eject the raw material gas in the same height range in the inner tube 11. In other words, the same raw material gas is supplied from the plurality of gas nozzles 31, 34, and 37 with respect to one wafer W. The gas nozzles 31, 34, and 37 are disposed symmetrically with respect to a straight line L that connects the center C of the inner tube 11 and the center of the exhaust slit 15. In the embodiment, the gas nozzle 34 is disposed on the straight line L, and the gas nozzles 31 and 37 are disposed symmetrically with respect to the straight line L. The gas nozzles 31, 34, and 37 may be configured to be further connected to a purge gas supply source (not illustrated) to eject a purge gas into the inner tube 11.

The gas nozzles 32, 33, 35, and 36 eject various gases different from the raw material gas from a plurality of gas holes 32a, 33a, 35a, and 36a toward the wafer W in a substantially horizontal direction. The flow rates of the various gases ejected from the gas nozzles 32, 33, 35, and 36 are controlled by a flow rate controller (not illustrated) such as a mass flow controller. The various gases include, for example, a reaction gas, an etching gas, and a purge gas. The reaction gas is a gas that reacts with the raw material gas to produce a reaction product, and may be, for example, a gas containing oxygen or nitrogen. The etching gas is a gas that etches various films, and may be, for example, a gas containing halogen such as fluorine, chlorine, or bromine. The purge gas is a gas that purges the raw material gas or the reaction gas remaining in the processing container 10, and may be, for example, an inert gas.

The exhauster 50 exhausts the gas discharged from inside the inner tube 11 through the exhaust slit 15 and discharged from a gas outlet 28 through a space P1 between the inner tube 11 and the outer tube 12. The gas outlet 28 is formed above the support 20 as the side wall of the upper portion of the manifold 17. An exhaust passage 51 is connected to the gas outlet 28. A pressure adjusting valve 52 and a vacuum pump 53 are interposed in order in the exhaust passage 51, so that the inside of the processing container 10 may be exhausted.

The heater 70 is provided around the outer tube 12. The heater 70 is provided to, for example, a base plate (not illustrated). The heater 70 has a substantially cylindrical shape so as to cover the outer tube 12. The heater 70 includes, for example, a heating element to heat the wafer W in the processing container 10.

The controller 90 controls an operation of each component of the processing apparatus 1. The controller 90 may be, for example, a computer. A computer program that performs an operation of each component of the processing apparatus 1 is stored in a storage medium. The storage medium may be, for example, a flexible disk, a compact disk, a hard disk, a flash memory, and a DVD.

[Processing Method]

Descriptions will be made on a method for forming a silicon oxide film on the wafer W according to an atomic layer deposition (ALD) method using the processing apparatus 1 illustrated in FIGS. 1 and 2, as an example of a processing method of an embodiment.

First, the controller 90 controls the elevating mechanism 25 such that the boat 16 holding a plurality of wafers W is carried into the processing container 10, and the opening at the lower end of the processing container 10 is air-tightly closed and sealed by the cover body 21.

Subsequently, the controller 90 repeats a cycle including a step of supplying the raw material gas 51, a step of purging S2, a step of supplying the reaction gas S3, and a step of purging S4 a predetermined number of times, thereby forming a silicon oxide film having a desired thickness on a plurality of wafers W.

In step S1, a silicon-containing gas, which is a raw material gas, is ejected from the gas nozzles 31, 34, and 37 into the processing container 10, thereby adsorbing the silicon-containing gas on the plurality of wafers W.

In step S2, for example, the silicon-containing gas remaining in the processing container 10 is discharged by a cycle purge in which a gas replacement and a vacuum processing are repeated. The gas replacement is an operation that supplies a purge gas from at least one of the seven gas nozzles 31 to 37 into the processing container 10. The vacuum processing is an operation that exhausts the inside of the processing container 10 by the vacuum pump 53.

In step S3, an oxidizing gas, which is the reaction gas, is ejected from at least one of the gas nozzles 32, 33, 35, and 36 into the processing container 10, and thus, the silicon raw material gas adsorbed on the plurality of wafers W is oxidized by the oxidizing gas.

In step S4, for example, the oxidizing gas remaining in the processing container 10 is discharged by a cycle purge in which a gas replacement and a vacuum processing are repeated. Step S4 may be the same as step S2.

After repeating the ALD cycle including steps S1 to S4 a predetermined number of times, the controller 90 controls the elevating mechanism 25 to carry the boat 16 out from the processing container 10.

Descriptions will be made on a method for forming a silicon film on the wafer W according to a chemical vapor deposition (CVD) method using the processing apparatus 1 illustrated in FIGS. 1 and 2, as another example of the processing method of the embodiment.

First, the controller 90 controls the elevating mechanism 25 such that the boat 16 holding a plurality of wafers W is carried into the processing container 10, and the opening at the lower end of the processing container 10 is air-tightly closed and sealed by the cover body 21.

Subsequently, the controller 90 ejects the silicon-containing gas, which is the raw material gas from the gas nozzles 31, 34, and 37 into the processing container 10, thereby forming a silicon film having a desired film thickness on the wafer W.

Subsequently, the controller 90 controls the elevating mechanism 25 such that the boat 16 is carried out from inside the processing container 10.

According to the embodiment described above, the three gas nozzles 31, 34, and 37 that eject the same raw material gas into the inner tube 11 are disposed symmetrically with respect to the straight line L that connects the center C of the inner tube 11 and the center of the exhaust slit 15. Then, each of the gas nozzles 31, 34, and 37 is configured to be able to change the flow rate of the raw material gas each ejected therefrom. Therefore, it is possible to control the concentration distribution of the reactive species produced by thermal composition of the raw material gas on the wafer W may be controlled by changing the flow rate allocation of the raw material gas ejected from the three gas nozzles 31, 34, and 37. As a result, it is possible to adjust the film thickness distribution of the silicon oxide film formed on the wafer W.

In particular, it is possible to enlarge the adjustment range of the film thickness distribution by changing the flow rate allocation of the raw material gas ejected from each of the gas nozzles 31, 34, and 37 in a state where the flow rate of the raw material gas ejected from the pair of gas nozzles 31 and 37 disposed symmetrically with respect to the straight line L is set to the same flow rate.

EXAMPLE

Example 1

In Example 1, a silicon film is formed on the wafer W according to the CVD method using the processing apparatus 1 illustrated in FIGS. 1 and 2. In Example 1, $Si_2H_6$ is supplied from one gas nozzle 34 or the three gas nozzles 31, 34 and 37. Further, the flow rate of $Si_2H_6$ supplied from one gas nozzle 34 and the total flow rate of $Si_2H_6$ supplied from the three gas nozzles 31, 34, and 37 are set to the same flow rate as each other. More specifically, the flow rate of $Si_2H_6$ supplied from one gas nozzle 34 is set to 350 sccm, and the flow rate of $Si_2H_6$ supplied from each of the three gas nozzles 31, 34, and 37 are set to 117 sccm. With respect to other conditions, the conditions in which $Si_2H_6$ is supplied from one gas nozzle 34 and the conditions in which $Si_2H_6$ is supplied from the three gas nozzles 31, 34, and 37 are set to be the same as each other.

Figure 3:
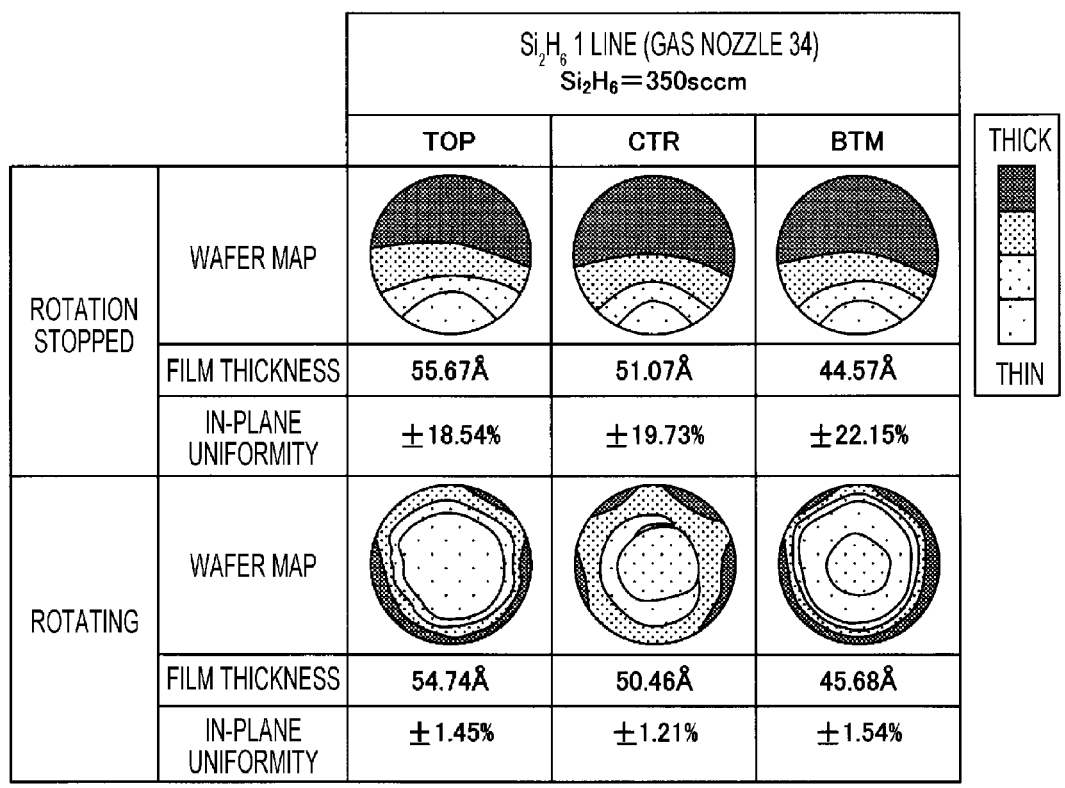
FIG. 3 is a view illustrating a film formation result in a case where $Si_2H_6$ is supplied from one gas nozzle.

FIG. 3 is a view illustrating a film formation result in a case where $Si_2H_6$ is supplied from one gas nozzle 34. In FIG. 3, a wafer map, a film thickness, and in-plane uniformity of the silicon films formed on the wafers W disposed in a TOP region, a CTR region, and a BTM region are illustrated in order from the left. The upper tier in FIG. 3 illustrates the result when the film forming processing is performed in a state where the rotation of the wafer W is stopped, and the lower tier in FIG. 3 illustrates the result when the film forming processing is performed in a state where the wafer W is rotated with the vertical direction as the rotation axis. The TOP region, the CTR region, and the BTM region refer to the upper portion, the central portion, and the lower portion in the height direction of the boat 16, respectively. The wafer map illustrates the in-plane distribution of the film thickness of the silicon film formed on the wafer W, the 6 o'clock direction indicates the direction in which the gas nozzle 34 is disposed, and the 12 o'clock direction indicates the direction in which the exhaust slit 15 is disposed.

As illustrated in the upper tier in FIG. 3, when $Si_2H_6$ is supplied from one gas nozzle 34, the film thickness of the silicon film is the thinnest in the 6 o'clock direction and increases in a fan shape, and is the thickest in the 12 o'clock direction, in the state where the rotation of the wafer W is stopped. This is because the deposition of the silicon film is caused by the concentration of the reactive species produced by the thermal decomposition of the raw material gas, and it is considered that the raw material gas ejected from the gas nozzle 34 is gradually heated and thermally decomposed, and thus, the film thickness is increased. When the amount of the gas consumed on the wafer W is large, or when the raw material gas is turned into plasma by excitation at the position of the gas nozzle 34, the film thickness on the gas nozzle 34 side is the thickest, and the film thickness on the exhaust slit 15 side may be reduced due to the influence of gas consumption or deactivation. In any cases, the film thickness increases or decreases starting from the position of the gas nozzle 34 that supplies the raw material gas.

As illustrated in the lower tier in FIG. 3, in the state where the wafer W is rotated, the film thickness is distributed such that the film thickness of the end portion of the wafer is thicker than that of the center portion of the wafer.

Figure 4:
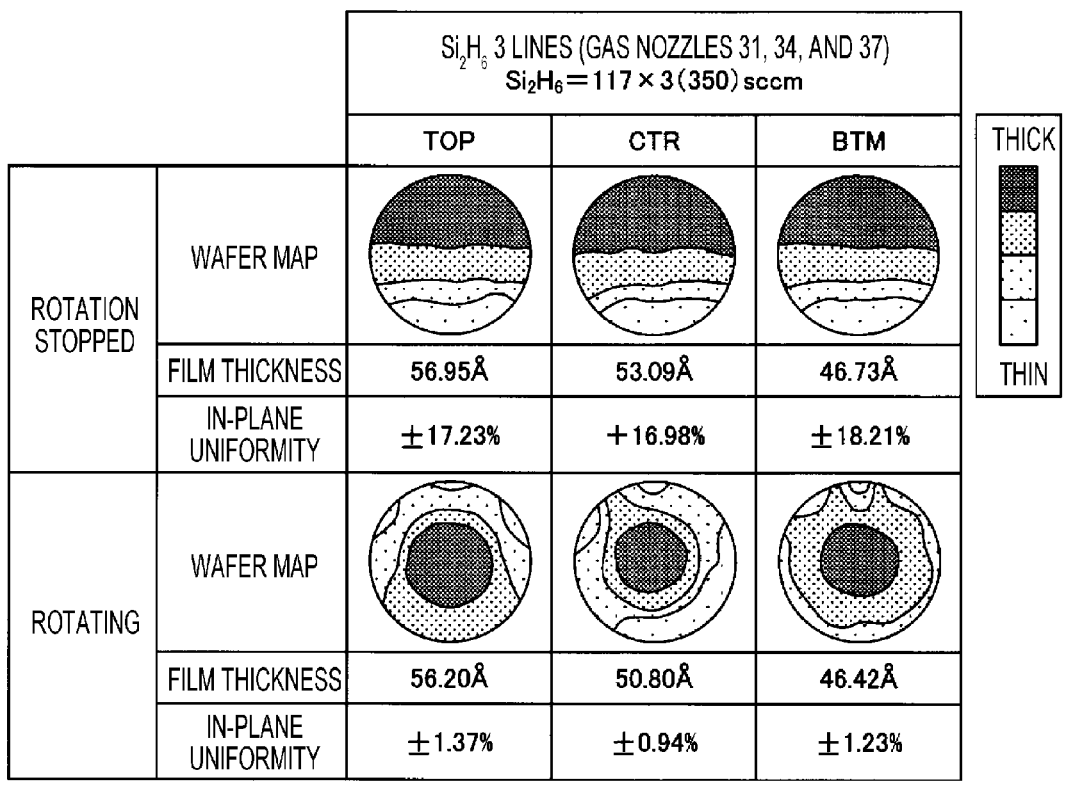
FIG. 4 is a view illustrating a film formation result in a case where $Si_2H_6$ is supplied from three gas nozzles.

FIG. 4 is a view illustrating a film formation result in a case where $Si_2H_6$ is supplied from the three gas nozzles 31, 34, and 37. In FIG. 4, a wafer map, a film thickness, and in-plane uniformity of the silicon films formed on the wafers W disposed in a TOP region, a CTR region, and a BTM region are illustrated in order from the left. The upper tier in FIG. 4 illustrates the result when the film forming processing is performed in a state where the rotation of the wafer W is stopped, and the lower tier in FIG. 4 illustrates the result when the film forming processing is performed in a state where the wafer W is rotated with the vertical direction as the rotation axis. The TOP region, the CTR region, and the BTM region refer to the upper portion, the central portion, and the lower portion in the height direction of the boat 16, respectively. The wafer map illustrates the in-plane distribution of the film thickness of the silicon film formed on the wafer W. The 6 o'clock direction indicates the direction in which the gas nozzle 34 is disposed, and the 12 o'clock direction indicates the direction in which the exhaust slit 15 is disposed.

As illustrated in the upper tier in FIG. 4, when $Si_2H_6$ is supplied from the three gas nozzles 31, 34, and 37, in the state where the rotation of the wafer W is stopped, the film thickness of the silicon film is thin in a range from the 4 o'clock direction to the 8 o'clock direction. As described above, in the example illustrated in the upper tier in FIG. 4, the region where the film thickness is thin is enlarged at the end portion of the wafer as compared with the example illustrated in the upper tier in FIG. 3. As a result, as illustrated in the lower tier in FIG. 4, in the state where the wafer W is rotated, the film thickness is distributed such that the film thickness of the end portion of the wafer is thinner than that of the center portion of the wafer.

Example 2

In Example 2, a silicon film is formed on the wafer W according to the CVD method using the processing apparatus 1 illustrated in FIGS. 1 and 2. In Example 2, while the total flow rate of $Si_2H_6$ supplied from the three gas nozzles 31, 34, and 37 is fixed at 600 sccm, the flow rate allocation of $Si_2H_6$ supplied from each of the three gas nozzles 31, 34, and 37 is changed. There are four levels of the flow rate allocation of $Si_2H_6$, that is, the gas nozzle 31/the gas nozzle 34/the gas nozzle 37=200/200/200 sccm, 150/300/150 sccm, 100/400/100 sccm, and 0/600/0 sccm.

Figure 5A:
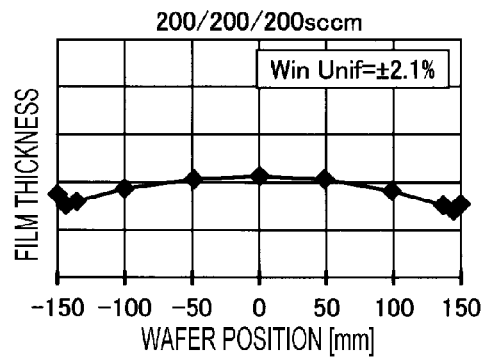
FIGS. 5A to 5D are views illustrating results of an experiment in which a film thickness distribution is adjusted by changing a flow rate allocation.
Figure 5B:
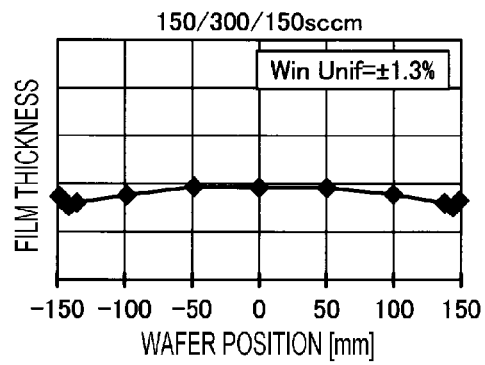
Figure 5C:
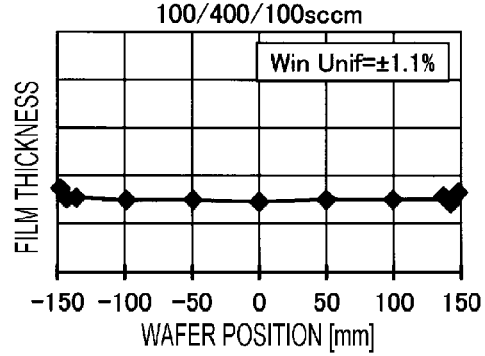
Figure 5D:
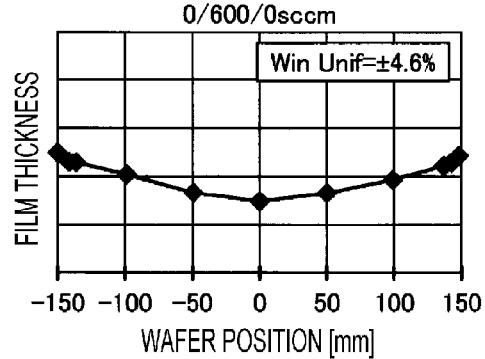

FIGS. 5A to 5D are views illustrating results of an experiment in which a film thickness distribution is adjusted by changing a flow rate allocation. In FIGS. 5A to 5D, the horizontal axis indicates the wafer position (mm), and the vertical axis indicates the film thickness of the silicon film. As for the wafer position, 0 mm is the center of the wafer W, and ±150 mm is the outer end of the wafer W. FIG. 5A illustrates the results when the flow rate allocation is the gas nozzle 31/the gas nozzle 34/the gas nozzle 37=200/200/200 sccm. FIG. 5B illustrates the results when the flow rate allocation is the gas nozzle 31/the gas nozzle 34/the gas nozzle 37=150/300/150 sccm. FIG. 5C illustrates the results when the flow rate allocation is the gas nozzle 31/the gas nozzle 34/the gas nozzle 37=100/400/100 sccm. FIG. 5D illustrates the results when the flow rate allocation is the gas nozzle 31/the gas nozzle 34/the gas nozzle 37=0/600/0 sccm.

As illustrated in FIGS. 5A to 5D, there is a tendency for the film thickness distribution to gradually change from a convex shape to a concave shape as the flow rate of $Si_2H_6$ supplied from the gas nozzle 34 increases and the flow rate of $Si_2H_6$ supplied from the gas nozzles 31 and 37 decreases. From the result, it is found out that a desired film thickness distribution is obtained by changing the flow rate allocation of $Si_2H_6$ supplied from the gas nozzles 31, 34, and 37.

Further, as illustrated in FIGS. 5A to 5D, there is a tendency that high in-plane uniformity is obtained as compared with the case where $Si_2H_6$ is ejected from one gas nozzle 34, by ejecting $Si_2H_6$ from the three gas nozzles 31, 34, and 37. More specifically, as illustrated in FIG. 5A, the in-plane uniformity (Win Unit) of the film thickness in the case where the flow rate allocation is the gas nozzle 31/the gas nozzle 34/the gas nozzle 37=200/200/200 sccm is ±2.1%. As illustrated in FIG. 5B, the in-plane uniformity of the film thickness in the case where the flow rate allocation is the gas nozzle 31/the gas nozzle 34/the gas nozzle 37=150/300/150 sccm is ±1.3%. As illustrated in FIG. 5C, the in-plane uniformity of the film thickness in the case where the flow rate allocation is the gas nozzle 31/the gas nozzle 34/the gas nozzle 37=100/400/100 sccm is ±1.1%. As illustrated in FIG. 5D, the in-plane uniformity of the film thickness in the case where the flow rate allocation is the gas nozzle 31/the gas nozzle 34/the gas nozzle 37=0/600/0 sccm is ±4.6%.

[Simulation Result]

First, in the processing apparatus 1 illustrated in FIGS. 1 and 2, a simulation by thermofluid analysis is implemented with respect to the concentration distribution of the reactive species in the processing container 10 when the flow rate allocation of the raw material gas ejected from the gas nozzles 31, 34, and 37 is changed. In the simulation, the flow rate of the raw material gas ejected from the gas nozzle 31 and the flow rate of the raw material gas ejected from the gas nozzle 37 are always set to the same flow rate. The concentration distribution of the reactive species is the analysis target because it is considered that the film thickness of a predetermined film formed on the wafer W is based on the concentration of the reactive species produced by the thermal decomposition of the raw material gas. The conditions of the simulation are as follows.

Figure 7:
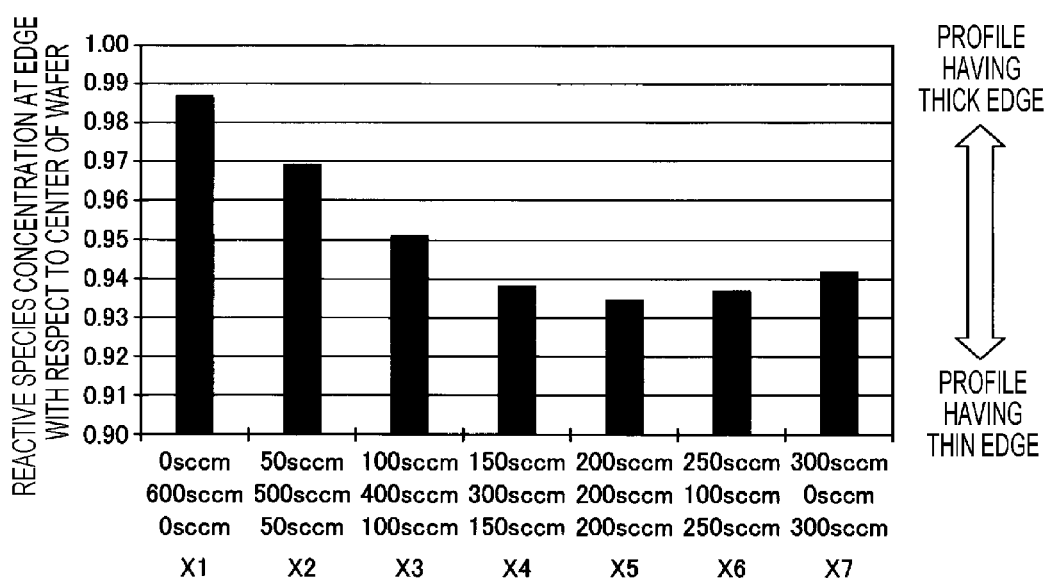
FIG. 7 is a view illustrating a result of a simulation in which a film thickness distribution is adjusted by changing a flow rate allocation.

[Simulation Conditions]
Raw material gas: $Si_2H_6$
Flow rate allocation: Seven levels of X1 to X7
X1: 0/600/0 sccm
X2: 50/500/50 sccm
X3: 100/400/100 sccm
X4: 150/300/150 sccm
X5: 200/200/200 sccm
X6: 250/100/250 sccm
X7: 300/0/300 sccm FIGS. 6 and 7 are views illustrating results of simulations in which the film thickness distribution is adjusted by changing the flow rate allocation. In FIG. 6, a wafer center gas concentration ($kmol/m^3$) indicates the concentration of the reactive species at the center of the wafer, a wafer edge average gas concentration ($kmol/m^3$) indicates the average concentration of the reactive species on the circumference of 297 mm in diameter having the center of the wafer as the center. Further, the wafer edge average gas concentration in a case where the wafer center gas concentration is set to 1 is also calculated. In FIG. 7, the horizontal axis indicates the levels X1 to X7 of the flow rate allocation, and the vertical axis indicates the wafer edge average gas concentration when the waver center gas concentration is set to 1.

From the simulation results illustrated in FIGS. 6 and 7, the following may be seen. The average concentration of the reactive species at the end portion (edge) with respect to the center of the wafer is the highest when the raw material gas is ejected from one gas nozzle 34 (level X1). In the state where the total flow rate of the raw material gas ejected from the gas nozzles 31, 34, and 37 are fixed, the average concentration of the reactive species at the edge with respect to the center of the wafer decreases as the flow rate of the raw material gas ejected from the gas nozzles 31 and 37 increases (levels X1 to X5). When the flow rate allocations of the three gas nozzles 31, 34, and 37 are even, the average concentration of the reactive species at the edge with respect to the center of the wafer is the lowest (level X5). The simulation results illustrated in FIGS. 6 and 7 substantially coincide with the results of the film thickness distribution obtained in Example 2 described above.

Next, in the processing apparatus 1 illustrated in FIGS. 1 and 2, a simulation by thermofluid analysis is implemented with respect to the concentration distribution of the reactive species in the processing container 10 when the flow rate allocation of the raw material gas ejected from the gas nozzles 31, 34, and 37 is changed. In the simulation, while the flow rate of the raw material gas ejected from gas nozzle 34 is fixed at 200 sccm, the flow rate allocations of the raw material gas ejected from the gas nozzle 31 and the raw material gas ejected from the gas nozzle 37 are changed. The concentration distribution of the reactive species is the analysis target because it is considered that the film thickness of a predetermined film formed on the wafer W is based on the concentration of the reactive species produced by the thermal decomposition of the raw material gas. The conditions of the simulation are as follows.

[Simulation Conditions]
Raw material gas: $Si_2H_6$
Flow rate allocation: Five levels of Y1 to Y5
Y1: 200/200/200 sccm
Y2: 250/200/150 sccm
Y3: 300/200/100 sccm
Y4: 350/200/50 sccm
Y5: 400/200/0 sccm The level Y1 is a symmetrical gas flow method in which the flow rates of the raw material gas elected from the two gas nozzles 31 and 37 are uniform. The level Y5 is a case where the raw material gas is not ejected from the gas nozzle 37, and is a condition in which the deviation of the gas flow rate in the processing container 10 is the largest.

Figure 9:
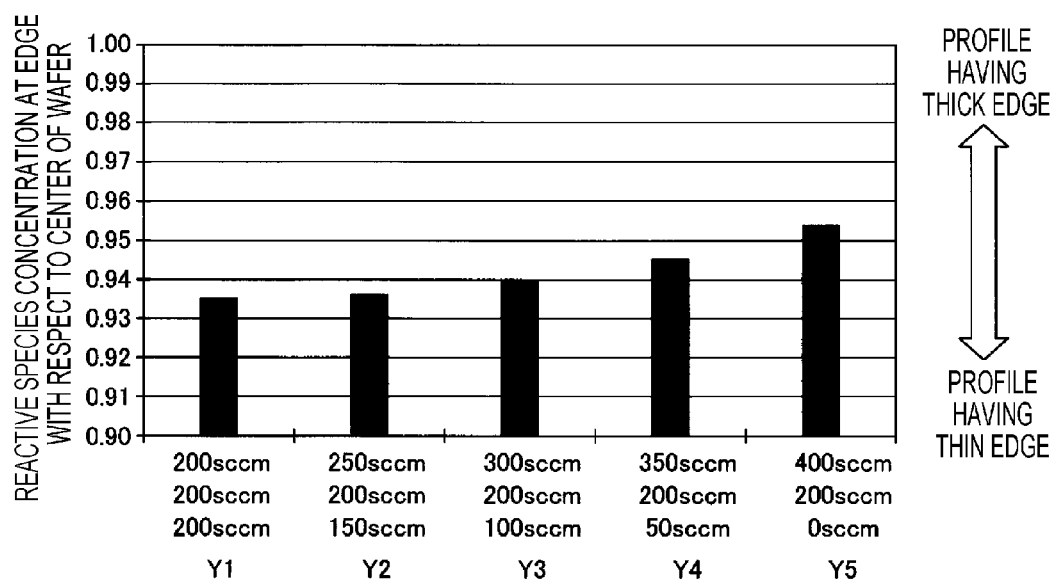
FIG. 9 is a view illustrating a result of a simulation in which a film thickness distribution is adjusted by changing a flow rate allocation.

FIGS. 8 and 9 are views illustrating results of simulations in which the film thickness distribution is adjusted by changing the flow rate allocation. In FIG. 8, a wafer center gas concentration ($kmol/m^3$) indicates the concentration of the reactive species at the center of the wafer, a wafer edge average gas concentration ($kmol/m^3$) indicates the average concentration of the reactive species on the circumference of 297 mm in diameter having the center of the wafer as the center. Further, the wafer edge average gas concentration in a case where the wafer center gas concentration is set to 1 is also calculated. In FIG. 9, the horizontal axis indicates the levels Y1 to Y5 of the flow rate allocation, and the vertical axis indicates the wafer edge average gas concentration when the waver center gas concentration is set to 1.

From the simulation results illustrated in FIGS. 8 and 9, the following may be seen. The average concentration of the reactive species at the edge with respect to the center of the wafer is the lowest when the same flow rate of the gas is ejected from the gas nozzles 31 and 37, that is, when the gas flow method which is uniform and symmetrical is used (levels Y1 to Y5). The average concentration of the reactive species at the edge with respect to the center of the wafer increases as the flow rate difference between the raw material gas ejected from the gas nozzle 31 and the raw material gas ejected from the gas nozzle 37 increases.

According to the simulation results illustrated in the above FIGS. 6 to 9, it may be said that, when the gas flow method which is uniform and symmetrical is used, the average concentration of the reactive species at the edge with respect to the center of the wafer may be adjusted in the largest range (0.935 to 0.987). That is, it may be said that the adjustment range of the in-plane distribution of the film thickness may be enlarged by ejecting the raw material gas such that the flow rate allocation of the raw material gas ejected from a plurality of gas nozzles is symmetrical with respect to the straight line L. In order to realize this, the plurality of gas nozzles may be disposed symmetrically with respect to the straight line L that connects the center C of the inner tube 11 and the center of the exhaust slit 15.

In the above embodiment, the raw material gas is an example of a processing gas.

In the above embodiment, the case where the number of gas nozzles that supply the same raw material gas is three has been described as an example, but the present disclosure is not limited thereto. For example, the number of gas nozzles that supply the same raw material gas may be four or more.

Figure 10:
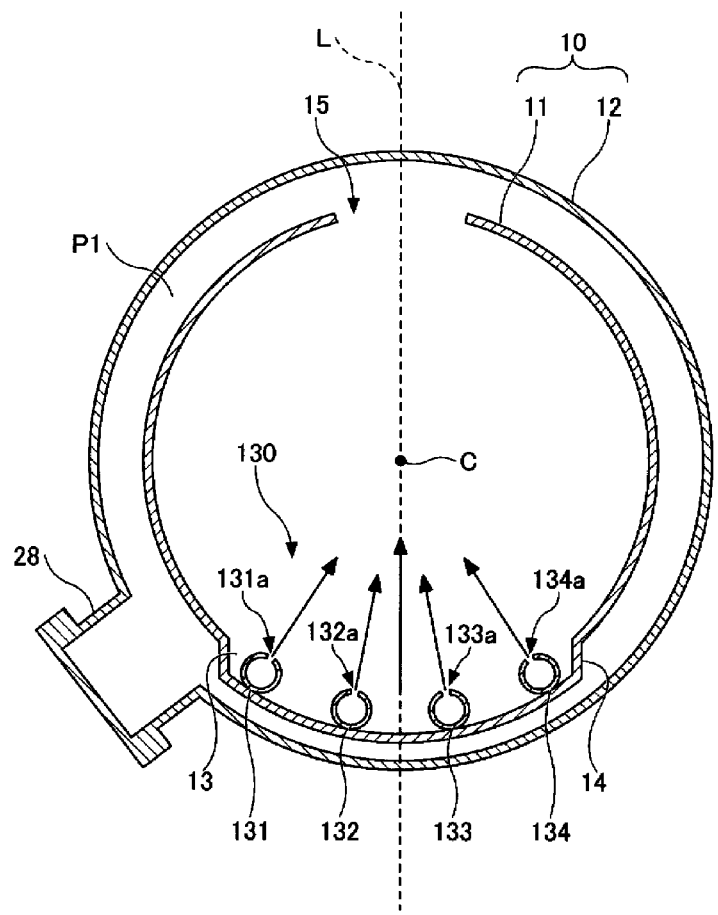
FIG. 10 is a schematic view illustrating another example of arrangement of gas nozzles.

FIG. 10 is a schematic view illustrating another example of arrangement of gas nozzles. In FIG. 10, the illustration of gas nozzles other than the gas nozzles that eject the raw material gas is omitted. As illustrated in FIG. 10, a gas supply unit 130 includes four gas nozzles 131 to 134. Each of the four gas nozzles 131 to 134 ejects the same raw material gas into the processing container 10. Each of the gas nozzles 131 to 134 has a plurality of gas holes 131a to 134a at predetermined intervals along the longitudinal direction. The plurality of gas holes 131a to 134a are oriented toward, for example, the center C of the inner tube 11 (the wafer W side). The four gas nozzles 131 to 134 are disposed symmetrically with respect to the straight line L that connects the center C of the inner tube 11 and the center of the exhaust slit 15. More specifically, the gas nozzle 131 and the gas nozzle 134 are disposed symmetrically with respect to the straight line L, and the gas nozzles 132 and the gas nozzle 133 are disposed symmetrically with respect to the straight line L.

Figure 11:
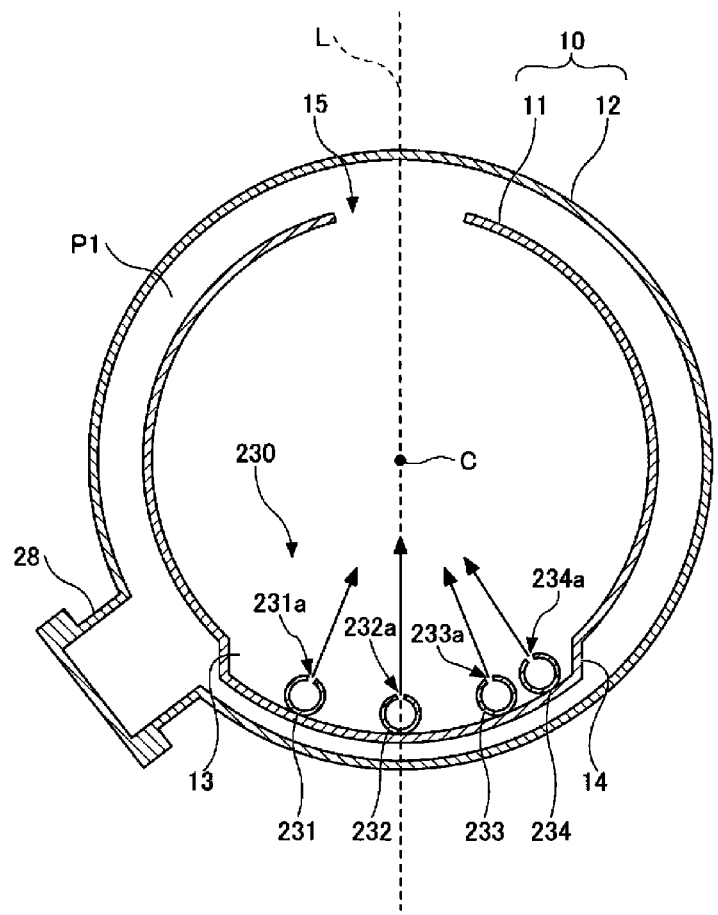
FIG. 11 is a schematic view illustrating yet another example of arrangement of gas nozzles.

FIG. 11 is a schematic view illustrating yet another example of arrangement of gas nozzles. In FIG. 11, the illustration of gas nozzles other than the gas nozzles that eject the raw material gas is omitted. As illustrated in FIG. 11, a gas supply 230 includes four gas nozzles 231 to 234. Each of the four gas nozzles 231 to 234 ejects the same raw material gas into the processing container 10. Each of the gas nozzles 231 to 234 has a plurality of gas holes 231a to 234a at predetermined intervals along the longitudinal direction. The plurality of gas holes 231a to 234a are oriented toward, for example, the center C of the inner tube 11 (the wafer W side). The three gas nozzles 231 to 233 among the four gas nozzles 231 to 234 are disposed symmetrically with respect to the straight line L that connects the center C of the inner tube 11 and the center of the exhaust slit 15. More specifically, the gas nozzle 232 is disposed on the straight line L, and the gas nozzle 231 and the gas nozzle 233 are disposed symmetrically with respect to the straight line L. The remaining one gas nozzle 234 among the four gas nozzles 231 to 234 is disposed in the accommodation portion 13 adjacent to the gas nozzle 233 in the circumferential direction. As described above, the plurality of gas nozzles that supply the same raw material gas may include at least three gas nozzles that are disposed symmetrically with respect to the straight line L, and include gas nozzles other than the three gas nozzles disposed symmetrically.

In the above-described embodiment, descriptions have been made on the case where the processing gas is the raw material gas, but the present disclosure is not limited thereto. For example, the processing gas may be a reaction gas.

In the above-described embodiment, descriptions have been made on the case where the gas nozzle is an L-shaped pipe, but the present disclosure is not limited thereto. For example, the gas nozzle may be a straight pipe that extends inside the side wall of the inner tube along the longitudinal direction of the inner tube, and is supported by inserting the lower end thereof into a nozzle support (not illustrated).

In the above-described embodiment, descriptions have been made on the case where the processing apparatus is an apparatus that supplies a gas from the gas nozzle disposed along the longitudinal direction of the processing container, and exhausts the gas from the exhaust slit disposed facing the gas nozzle, but the present disclosure is not limited thereto. For example, the processing apparatus may be an apparatus that supplies a gas from a gas nozzle disposed along the longitudinal direction of the wafer boat, and exhaust the gas from a gas outlet disposed above or below the wafer boat.

In the above-described embodiment, descriptions have been made on the case where the processing container is a container having a double tube structure including the inner tube and the outer tube, but the present disclosure is not limited thereto. For example, the processing container may be a container having a single tube structure.

In the above-described embodiment, descriptions have been made on the case where the processing apparatus is a non-plasma apparatus, but the present disclosure is not limited thereto. For example, the processing apparatus may be a plasma apparatus such as a capacitively coupled plasma apparatus or an inductively coupled plasma apparatus.

According to the present disclosure, it is possible to enlarge the adjustment range of the in-plane distribution of the film thickness.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. A processing apparatus comprising:
a processing container having a substantially cylindrical shape and provided with an exhaust slit on a side wall;
a plurality of gas nozzles extending in a vertical direction along an inside of the side wall of the processing container and disposed symmetrically with respect to a straight line extending from a center of the exhaust slit to a portion of the side wall positioned opposite to the exhaust slit via a center of the processing container, the plurality of gas nozzles including both a gas nozzle disposed on the straight line and at least two other gas nozzles disposed on a same arc extending along an inner circumference of the processing container when viewed in a horizontal cross section,
at least one memory storing executable instructions; and
at least one processor configured to execute the executable instructions to:
control the plurality of gas nozzles including the gas nozzle disposed on the straight line to eject a same processing gas into the processing container.

2. The processing apparatus according to claim 1, wherein each of the plurality of gas nozzles ejects the processing gas to a same height range in the processing container.

3. The processing apparatus according to claim 2, wherein each of the plurality of gas nozzles has a plurality of gas holes provided at intervals along a longitudinal direction, and the plurality of gas holes are oriented toward a center of the processing container.

4. The processing apparatus according to claim 3, wherein the plurality of gas nozzles have a same inner diameter.

5. The processing apparatus according to claim 1, wherein the plurality of gas nozzles include a pair of gas nozzles disposed symmetrically with respect to the straight line.

6. The processing apparatus according to claim 5,
wherein the processor is configured to execute the executable instructions to:
control a flow rate of the processing gas ejected from the plurality of nozzles into the processing container, and
control the pair of gas nozzles to eject the processing gas into the processing container at a same flow rate.

7. The processing apparatus according to claim 6, wherein a plurality of substrates is substantially horizontally accommodated in the processing container at intervals in the vertical direction.

8. The processing apparatus according to claim 7, wherein the plurality of substrates are rotatable around a vertical rotation axis in the processing container.

9. The processing apparatus according to claim 1, wherein each of the plurality of gas nozzles has a plurality of gas holes provided at intervals along a longitudinal direction of the gas nozzle, and the plurality of gas holes are oriented toward a center of the processing container.

10. The processing apparatus according to claim 1, wherein the plurality of gas nozzles have a same inner diameter.

11. The processing apparatus according to claim 1, wherein a plurality of substrates is substantially horizontally accommodated in the processing container at intervals in the vertical direction.

12. A processing method comprising:
providing a processing apparatus including:
a processing container having a substantially cylindrical shape and provided with an exhaust slit on a side wall; and
a plurality of gas nozzles extending in a vertical direction along an inside of the side wall of the processing container and disposed symmetrically with respect to a straight line extending from a center of the exhaust slit to a portion of the side wall positioned opposite to the exhaust slit via a center of the processing container, the plurality of gas nozzles including both a gas nozzle disposed on the straight line and at least two other gas nozzles disposed on a same arc extending along an inner circumference of the processing container when viewed in a horizontal cross section,
at least one memory storing executable instructions; and
at least one processor configured to execute the executable instructions to:
control the plurality of gas nozzles including the gas nozzle disposed on the straight line to eject a same processing gas into the processing container,
carrying a substrate into the processing container; and
supplying a processing gas into the processing container from a pair of gas nozzles among the plurality of gas nozzles at a same flow rate.

13. The processing apparatus according to claim 1, wherein a single gas nozzle among the plurality of the gas nozzles is disposed on the straight line.

14. The processing apparatus according to claim 3, wherein a center of each of the plurality of gas holes of each of the plurality of gas nozzles is oriented toward a center of the processing container when each of the plurality of gas nozzles is viewed in a horizontal cross section.

* * * * *